US012007682B2

(12) United States Patent
Noguchi et al.

(10) Patent No.: US 12,007,682 B2
(45) Date of Patent: Jun. 11, 2024

(54) IMAGE STABILIZATION APPARATUS, LENS APPARATUS, AND CAMERA

(71) Applicant: CANON KABUSHIKI KAISHA, Tokyo (JP)

(72) Inventors: Kazuhiro Noguchi, Utsunomiya (JP); Toma Kitayama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 543 days.

(21) Appl. No.: 16/537,783

(22) Filed: Aug. 12, 2019

(65) Prior Publication Data

US 2020/0073202 A1 Mar. 5, 2020

(30) Foreign Application Priority Data

Aug. 31, 2018 (JP) .................. 2018-163149

(51) Int. Cl.
*G03B 5/02* (2021.01)
*G02B 27/64* (2006.01)
(Continued)

(52) U.S. Cl.
CPC ............. *G03B 5/02* (2013.01); *G02B 27/646* (2013.01); *H01F 7/02* (2013.01); *H01F 7/081* (2013.01); *H01F 7/126* (2013.01); *H01F 7/1844* (2013.01); *H04N 23/55* (2023.01); *H04N 23/687* (2023.01); *H05K 1/189* (2013.01);
(Continued)

(58) Field of Classification Search
CPC .... G03B 5/02; G03B 5/06; G03B 2205/0007; G03B 2205/0069; G03B 2205/0015; G02B 27/646; G02B 7/02; H01F 7/02; H01F 7/081; H01F 7/126; H01F 7/1844; H01F 2007/062; H01F 2007/185; H01F 7/1646; H04N 5/2254; H04N 5/23287;
(Continued)

(56) References Cited

U.S. PATENT DOCUMENTS

2008/0074744 A1 3/2008 Osaka et al.
2009/0232483 A1* 9/2009 Anshita .................. G03B 17/02
359/557
(Continued)

FOREIGN PATENT DOCUMENTS

JP 2006058555 A 3/2006
JP 2006065352 A 3/2006
(Continued)

OTHER PUBLICATIONS

Office Action issued in Japanese Appln. No. 2018-163149 dated Jun. 21, 2022. English translation provided.

*Primary Examiner* — Marin Pichler
(74) *Attorney, Agent, or Firm* — ROSSI, KIMMS & McDOWELL LLP (57) ABSTRACT

An image stabilization apparatus includes a movable member configured to hold an image stabilization optical element, a fixed member holding the movable member movably in a direction crossing an optical axis, an electrical element mounted on the movable member, and a flexible sheet member electrically connecting the electric element to the fixed member. The flexible sheet member is fixed to the movable member and the fixed member so that the flexible sheet member is bent between the movable member and the fixed member.

7 Claims, 10 Drawing Sheets

(51) Int. Cl.
*H01F 7/02* (2006.01)
*H01F 7/08* (2006.01)
*H01F 7/126* (2006.01)
*H01F 7/18* (2006.01)
*H04N 5/225* (2006.01)
*H04N 5/232* (2006.01)
*H04N 23/55* (2023.01)
*H04N 23/68* (2023.01)
*H05K 1/18* (2006.01)
*H01F 7/06* (2006.01)

(52) U.S. Cl.
CPC ............... *G03B 2205/0007* (2013.01); *G03B 2205/0069* (2013.01); *H01F 2007/062* (2013.01); *H01F 2007/185* (2013.01); *H05K 2201/10083* (2013.01)

(58) Field of Classification Search
CPC ............ H04N 5/23264; H04N 5/2325; H04N 5/23258; H05K 1/189; H05K 2201/10083

USPC ................. 359/554, 557, 822, 824; 348/208
See application file for complete search history.

(56) References Cited

U.S. PATENT DOCUMENTS

| | | | | |
|---|---|---|---|---|
| 2012/0081559 | A1* | 4/2012 | Sato | G03B 5/00 348/208.11 |
| 2013/0100304 | A1* | 4/2013 | Wade | G02B 27/646 348/208.4 |
| 2013/0176620 | A1* | 7/2013 | Sato | G02B 27/646 359/557 |
| 2018/0231734 | A1* | 8/2018 | Ochi | G02B 7/021 |
| 2018/0284477 | A1 | 10/2018 | Minamisawa | |

FOREIGN PATENT DOCUMENTS

| | | |
|---|---|---|
| JP | 2007080929 A | 3/2007 |
| JP | 2008083330 A | 4/2008 |
| JP | 2010096861 A | 4/2010 |

* cited by examiner

IMAGE STABILIZATION APPARATUS, LENS APPARATUS, AND CAMERA

BACKGROUND OF THE INVENTION

Field of the Invention

The present invention relates to an image stabilization apparatus, a lens apparatus, and a camera.

Description of the Related Art

In order to prevent an image blur caused by a manual shake or the like, which is likely to occur during hand-held imaging, an image stabilization apparatus has conventionally been known that detects a camera shake situation through a shake detector and moves a correction lens in an optical axis orthogonal direction according to the detection result.

In general, in the image stabilization apparatus, a driver is an electromagnetic actuator that combines a magnetic circuit including a coil and a permanent magnet, and a position detector that combines a magnet and a magnetic detection element or a light emitting element and a light receiving element. When an electric component, such as a coil and a magnetic detection element, is disposed on a movable member, a flexible substrate is often used to electrically connect these components to a fixed member for assembly and reliability purposes. The flexible substrate is a flexible sheet member in which a copper wiring pattern is sandwiched between a plurality of resin films, and the movable member may be hindered from smoothly moving depending on a detour method. Accordingly, a variety of proposals have been made for proper disposing the flexible substrate in order to secure the image stabilization performance.

Japanese Patent Laid-Open No. ("JP") 2006-58555 discloses an optical shift apparatus that symmetrically disposes a flexible substrate in an idle space between a movable member and a fixed member viewed from an optical axis direction, wherein a wiring pattern of the flexible substrate extends in a width direction facing the optical axis direction, and the flexible substrate is folded a number of times into a predetermined shape in a longitudinal direction. The optical shift apparatus disclosed in JP 2006-58555 permits a movable member to move in the longitudinal and lateral directions relative to the fixed member due to the flexion in the longitudinal direction of the flexible substrate, and generates a driving load corresponding to the flexion amount.

JP 2006-65352 discloses an image stabilization apparatus that draws the flexible substrate from the movable member in one direction, largely bends it in an arc shape, and connects it to the fixed member on a plane where the movable member is movable in the optical axis direction wherein a wiring pattern of the flexible substrate extends in a width direction facing the optical axis direction. The image stabilization apparatus disclosed in JP 2006-65352 permits the movable member to move in the longitudinal direction and lateral direction relative to the fixed member due to the flexion of the flexible substrate in the longitudinal direction, and reduces a driving reaction by setting a movable portion as long as possible.

The optical shift apparatus disclosed in JP 2006-58555 previously bends the flexible substrate in the predetermined shape in the longitudinal direction and disposes it in the assembly process. If the bent position and bent angle scatter viewed from the optical axis direction, the shape deviates from the desired shape and thus it is necessary to secure a sufficient space so that the connector of the flexible substrate does not contact the fixed member etc. when the movable member moves. Further, when the bent angle tilts from 90° orthogonal to the longitudinal direction, the longitudinal direction tilts before and after the bent position and thus it is necessary to prevent contacts with front and back walls in the optical axis direction. If the connector of the flexible substrate contacts the fixed member or the like when the movable member moves, the driving load discontinuously changes and the image stabilization performance degrades. Moreover, if the force applied by the connector of the flexible substrate to the movable member largely biases within the movable range due to the bending error, the image stabilization is unavailable due to the driving power exceeding the permissible value at the end of the movable range.

Since JP 2006-65352 draws the flexible substrate from the movable member in one direction, bend it in a large arc, and connects it to the fixed member, the force to make the flexible substrate straight in the longitudinal direction is applied to the movable member. Therefore, a large detour space is necessary to reduce the driving load.

SUMMARY OF THE INVENTION

An aspect of embodiments provides, for example, an image stabilization apparatus beneficial in compactness thereof.

An image stabilization apparatus includes a movable member configured to hold an image stabilization optical element, a fixed member holding the movable member movably in a direction crossing an optical axis, an electrical element mounted on the movable member, and a flexible sheet member electrically connecting the electric element to the fixed member. The flexible sheet member is fixed to the movable member and the fixed member so that the flexible sheet member is bent between the movable member and the fixed member. A lens apparatus and a camera having the image stabilization apparatus also constitute another aspect of the present invention.

Further features of the present invention will become apparent from the following description of exemplary embodiments with reference to the attached drawings.

DESCRIPTION OF THE EMBODIMENTS

Referring now to the accompanying drawings, a description will be given of embodiments according to the present invention. Corresponding elements in respective figures will be designated by the same reference numerals, and a duplicate description thereof will be omitted.

Figure 1:
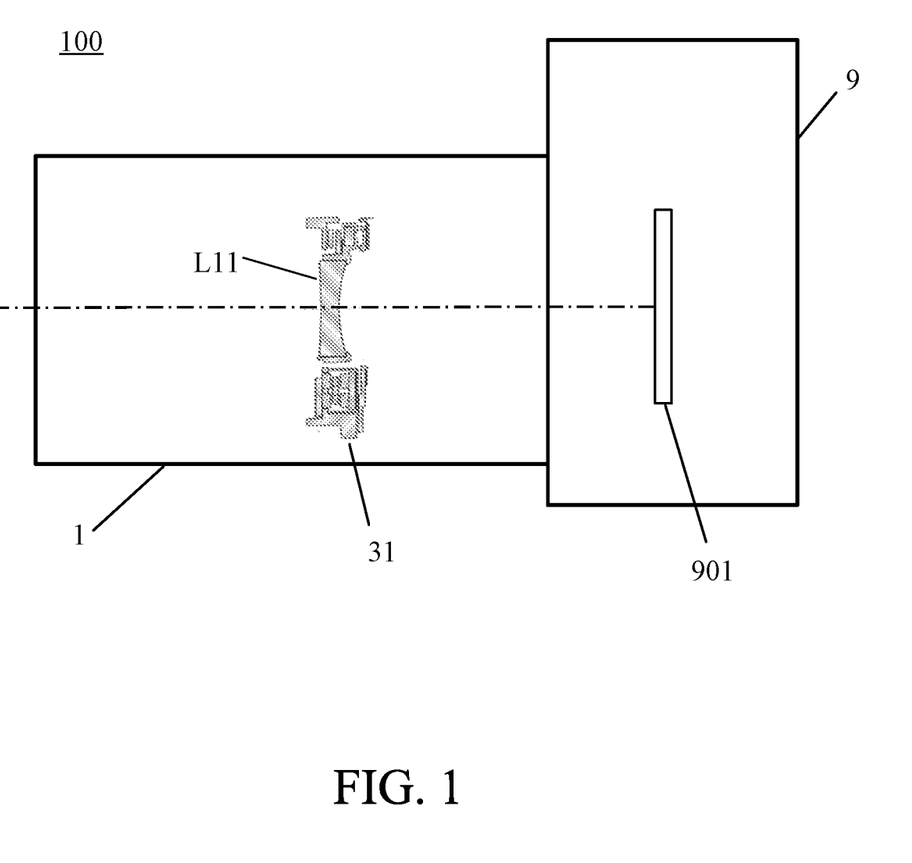
FIG. 1 a schematic view of a camera system according to one embodiment of the present invention.

FIG. 1 is a schematic view of a camera system 100 according to one embodiment of the present invention. The camera system 100 has an interchangeable lens (lens apparatus) 1 and a camera body (imaging apparatus) 9. The interchangeable lens 1 and the camera body 9 are mechanically integrated by an unillustrated mount. Moreover, they are electrically connected to each other through electrical contacts described later, and the interchangeable lens 1 and the camera body 9 communicate with each other for image capturing.

The interchangeable lens 1 includes an unillustrated imaging optical system and a support/drive configuration. The interchangeable lens 1 further includes an image stabilization apparatus 31. The image stabilization apparatus 31 includes a lens (image stabilization optical element) L11 that forms part of the imaging optical system, and corrects an image blur by moving the lens L11 on a plane orthogonal to the optical axis. The camera body 9 includes an image sensor 901. A light flux from the object is imaged on the image sensor 901 by the imaging optical system. The image sensor 901 is a solid-state image sensor, such as a CMOS, which converts a light amount incident on a pixel into a voltage signal by a photoelectric conversion.

Figure 2:
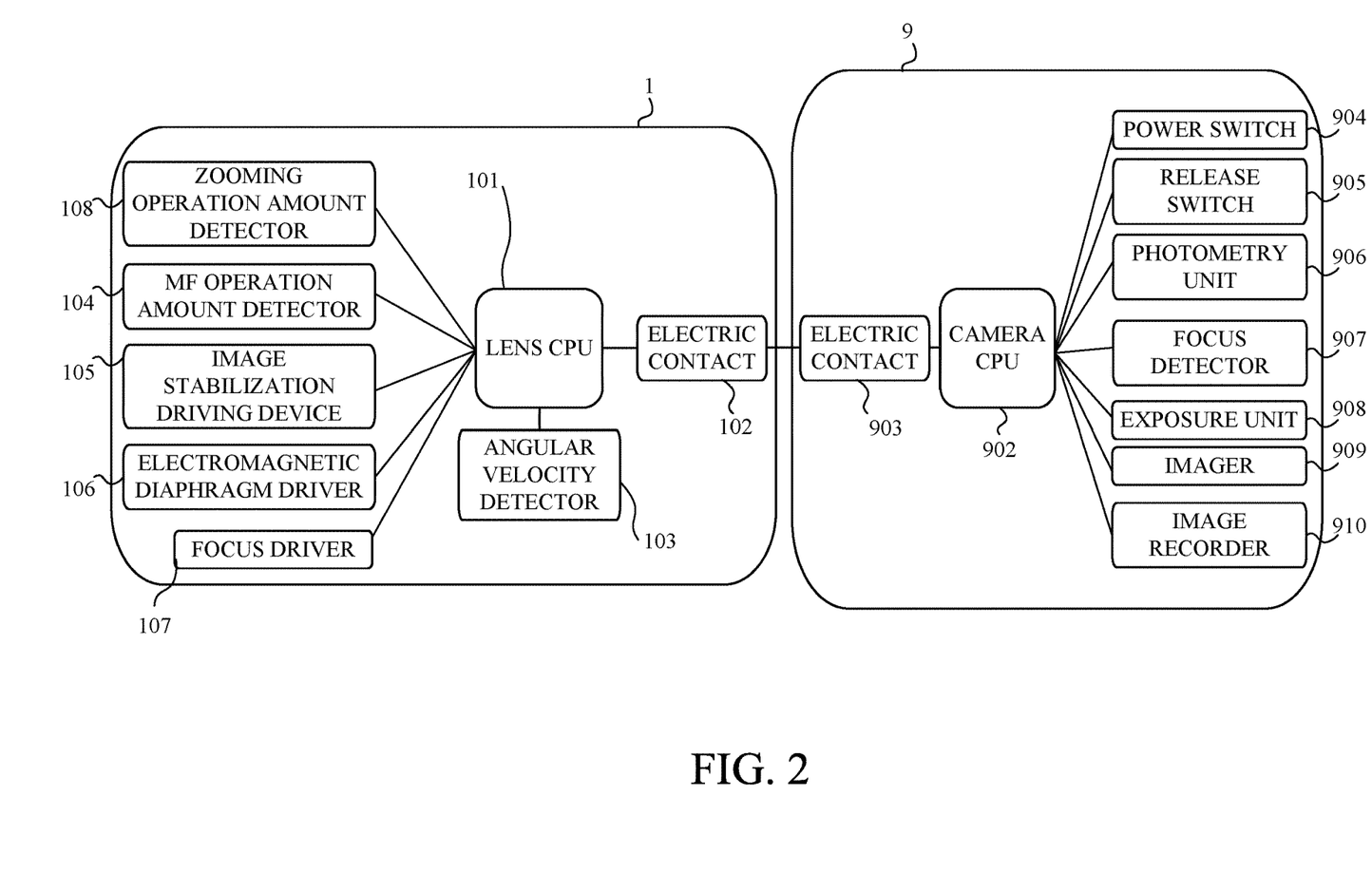
FIG. 2 is a block diagram of the camera system.

FIG. 2 is a block diagram of the camera system 100. The camera CPU 902 includes a microcomputer and controls the operation of each component in the camera body 9. In addition, when the interchangeable lens 1 is mounted on the camera body 9, the camera CPU 902 communicates, through electrical contacts 102 and 903, with a lens CPU 101 provided in the interchangeable lens 1 and configured to control the operation of each component in the interchangeable lens 1. The information that the camera CPU 902 transmits to the lens CPU 101 includes driving amount information of the focus lens and the like. The information transmitted from the lens CPU 101 to the camera CPU 902 includes imaging magnification information and the like. The electrical contacts 102 and 903 also include contacts for supplying the power from the camera body 9 to the interchangeable lens 1.

A power switch 904 is operable by a photographer to run the camera CPU 902 or to start supplying the power to actuators, sensors, and the like in the camera system 100. A release switch 905 is operable by the photographer, and includes a first stroke switch SW1 and a second stroke switch SW2. A signal from the release switch 905 is input to the camera CPU 902.

The camera CPU 902 enters an imaging preparation state when receiving an ON signal from the first stroke switch SW1. In the imaging preparation state, the object luminance is measured by the photometry unit 906 and the focus detection is made by the focus detector 907. The camera CPU 902 calculates an F-number (aperture value) of an unillustrated diaphragm unit mounted in the interchangeable lens 1, an exposure amount (shutter time) of the image sensor 901, and the like based on the photometric result. The camera CPU 902 determines a driving amount of an unillustrated focus lens to obtain the in-focus state for the object based on the focus information of the imaging optical system by the focus detector 907. The driving amount information of the focus lens is transmitted to the lens CPU 101. The camera CPU 902 starts controlling the image stabilization operation of the image stabilization apparatus 31 in the predetermined imaging mode.

The camera CPU 902 transmits a diaphragm drive command to the lens CPU 101 in response to the input of the ON signal from the second stroke switch SW2, and sets the diaphragm unit to the calculated F-number. The camera CPU 902 transmits an exposure start command to an exposure unit 908, and performs a retraction operation of an unillustrated mirror and an opening operation of an unillustrated shutter to expose an object image by an imager 909 including the image sensor 901. The imaging signal from the imager 909 is converted into a digital signal by a signal processor in the camera CPU 902, undergoes various correction processing, and is output as an image signal. The image signal data is written and stored in an image recording unit 910 in a semiconductor memory, such as a flash memory, or a recording medium, such as a magnetic disk and an optical disc.

A zooming operation amount detector 108 detects a rotation of an unillustrated zoom ring through an unillustrated sensor. An MF operation amount detector 104 detects a rotation of an unillustrated manual focus ring through an unillustrated sensor. An image stabilization driving device 105 has a drive actuator of the image stabilization apparatus 31 and its drive circuit. In response to an instruction from the lens CPU 101 that has received the diaphragm drive instruction from the camera CPU 902, an electromagnetic diaphragm driver 106 brings the diaphragm unit into an open state equivalent to the instructed F-number. A focus driver 107 drives the focus lens with an unillustrated focus drive mechanism according to the driving amount information of the focus lens transmitted from the camera CPU 902. An angular velocity detector 103 includes an unillustrated angular velocity sensor. The angular velocity detector 103 detects a pitch direction (longitudinal rotation) flexion and a yaw direction (lateral rotation) flexion, which are angular flexions, using an angular velocity sensor, and outputs the respective angular velocities to the lens CPU 101. The lens CPU 101 integrates angular velocity signals in the pitch direction and the yaw direction from the angular velocity sensor, and calculates an angular displacement amount in each direction. Then, the lens CPU 101 controls the image stabilization driving device 105 according to an angular displacement amount in the pitch direction and the yaw direction to shift and drive the lens L11 in the longitudinal direction and the lateral direction for the image stabilization.

Figure 3:
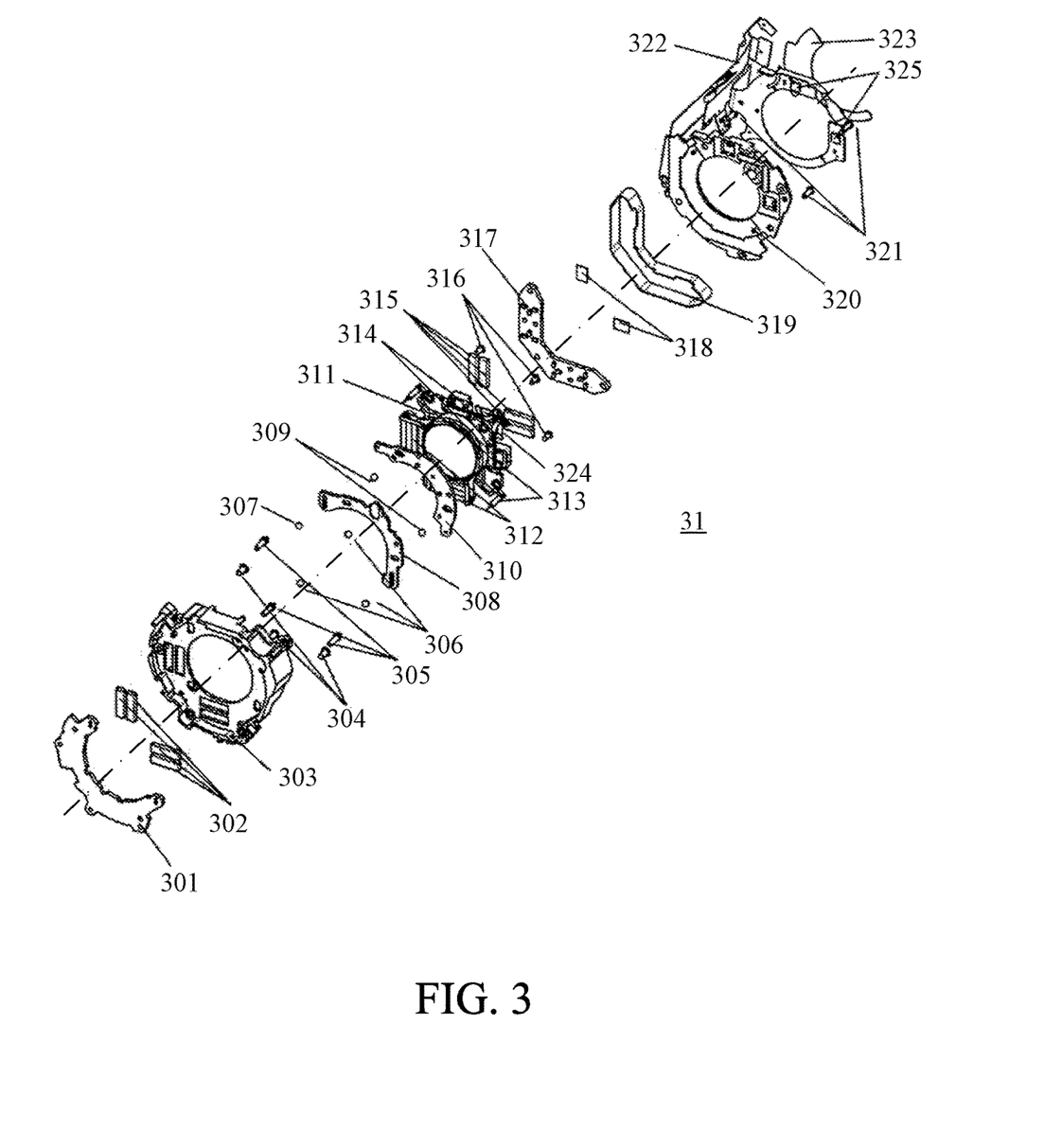
FIG. 3 is an exploded perspective view of an image stabilization apparatus viewed from an object side.
Figure 4:
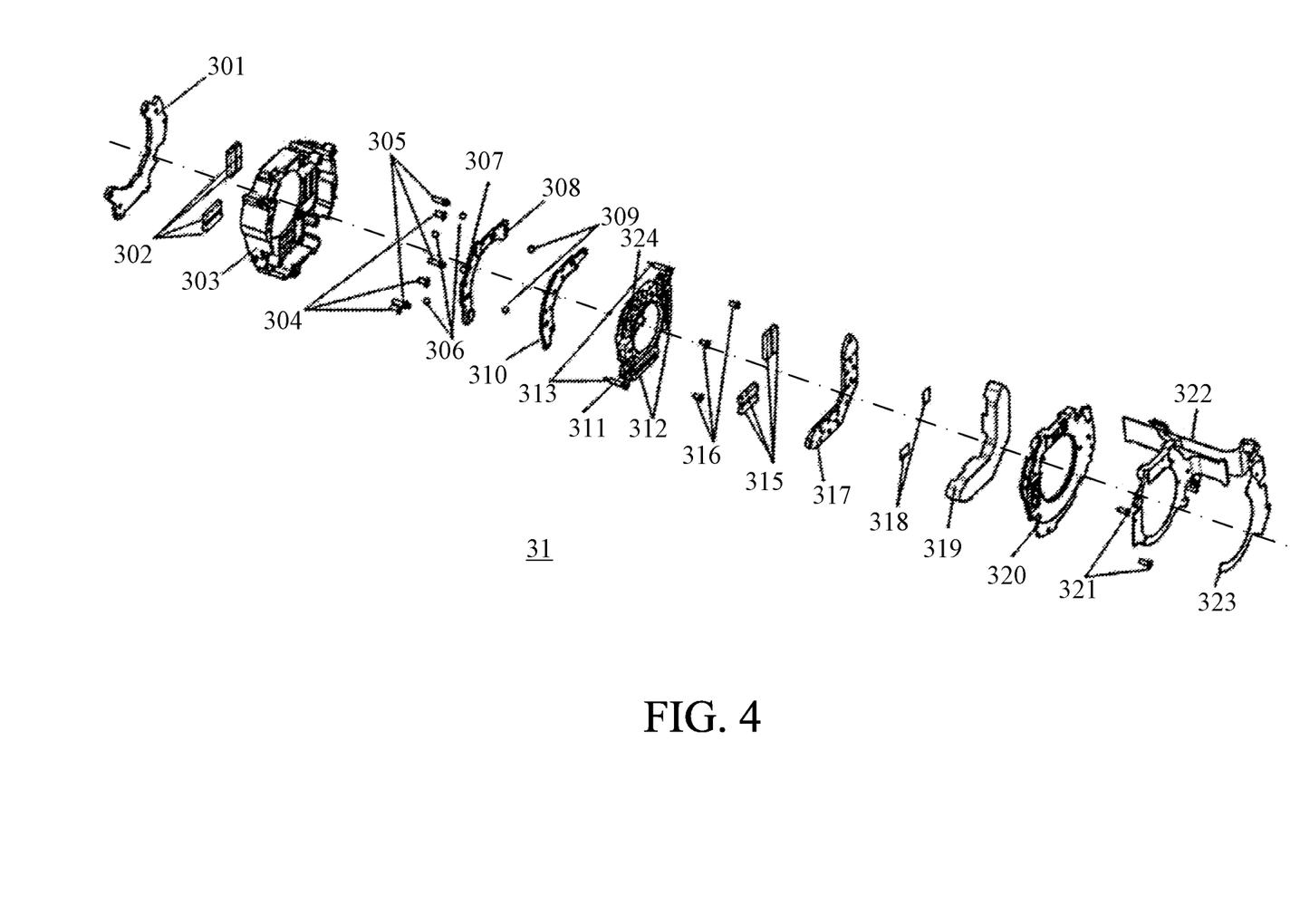
FIG. 4 is an exploded perspective view of the image stabilization apparatus viewed from an image plane side.
Figure 5:
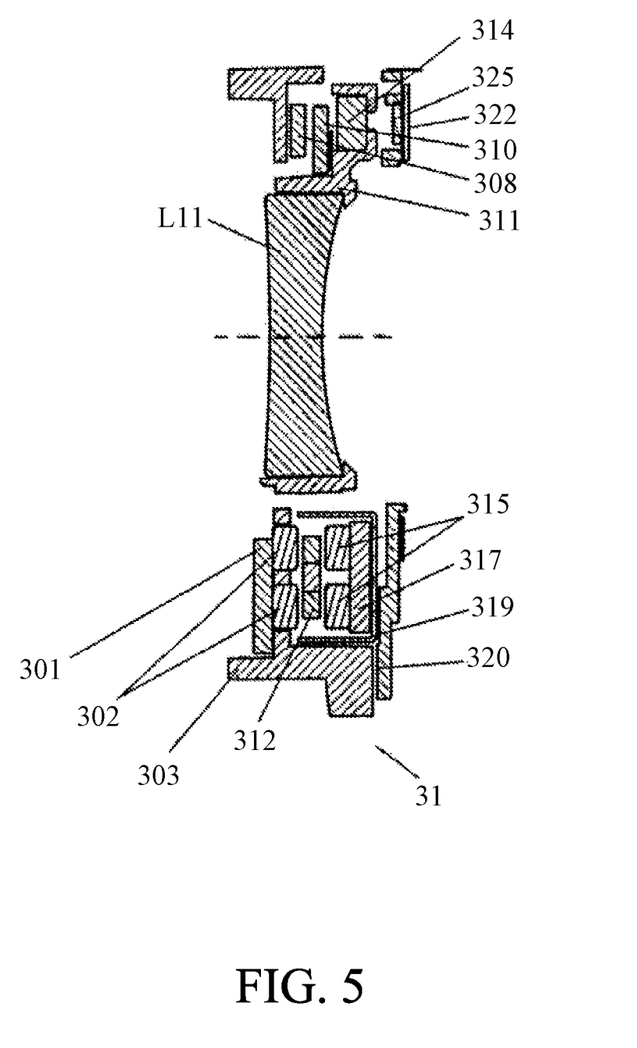
FIG. 5 is a sectional view of the image stabilization apparatus.

Referring now to FIGS. 3 to 5, a description will be given of a configuration of the image stabilization apparatus 31. FIG. 3 is an exploded perspective view of the image stabilization apparatus 31 viewed from the object side. FIG. 4 is an exploded perspective view of the image stabilization apparatus 31 viewed from the image plane side. FIG. 5 is a sectional view of the image stabilization apparatus 31.

A first yoke 301 is made of a magnetic material, and is screwed onto a base plate (fixed member) 303 by a screw 304. A first drive magnet 302 is disposed in an opening provided in the main plate 303, and fixed onto the first yoke 301 by the magnetic attraction. The first drive magnet 302 is a permanent magnet made of a neodymium magnet. A movable barrel (movable member) 311 holds the lens L11 and can correct a so-called manual vibration by moving the lens L11 on a plane orthogonal to the optical axis. The movable lens barrel 311 moves in the direction crossing the optical axis, which is not necessarily an optical axis orthogonal direction, for an image stabilization. A coil 312 and a position detecting magnet 314 as electric elements are fixed onto the movable lens barrel 311. A first guide plate 310 is screwed onto the movable barrel 311 by a screw 316 and integrated with the movable barrel 311. In other words, the first guide plate 310 forms a movable member. A second guide plate 308 is supported movably in the vertical direction on a plane orthogonal to the optical axis relative to the main plate 303 via a first rolling ball 306. The movable barrel 311 is supported movably in the lateral direction on a plane orthogonal to the optical axis relative to the second guide plate 308 via a second rolling ball 309. The movable lens barrel 311 is always pulled by a tension spring 313 relative to the base plate 303, and supported movably in the direction orthogonal to the optical axis via a third rolling ball 307 relative to the main plate 303. A second drive magnet 315 is fixed onto a second yoke 317 by the magnetic attraction where the second drive magnet 315 is positioned by a protrusion provided on the second yoke 317. The second drive magnet 315 is a permanent magnet made of a neodymium magnet. The second yoke 317 is fixed by the magnetic attraction force generated between the first drive magnet 302 and the second drive magnet 315 so as to sandwich a support 305 with the first yoke 301. The coil 312 is disposed in an air gap between the first drive magnet 302 and the second drive magnet 315. A horizontally striped noise suppression sheet metal 319 is adhered to the second yoke 317 by a double-sided tape 318. The horizontally stripe noise suppression sheet metal 319 is made of a nonmagnetic conductive material, such as copper and aluminum, and suppresses a rapid intensity change of the magnetic field generated by the coil 312 driven by the PWM, thereby suppressing the horizontal stripe noise generation superimposed on the image sensor 901. A sensor holding plate 320 fixes a relay flexible substrate 322 including a position detecting Hall IC 325. The sensor holding plate 320 is jointed and integrated with the main plate 303 with a pressing plate metal 323 by the screw 321. In other words, the sensor holding plate 320 forms a fixed member. A movable flexible substrate 324 is a flexible sheet member that electrically connects the electric element to the fixed member. The coil 312 is electrically connected to the movable flexible substrate 324 by soldering. The movable flexible substrate 324 is connected to a relay flexible substrate 322. The relay flexible substrate 322 is electrically connected to an unillustrated printed circuit board.

When the coil 312 is energized, a Lorentz force is generated, and the movable lens barrel 311 moves on the plane orthogonal to the optical axis. The coil 312, the first drive magnet 302, and the second drive magnet 315 are respectively arranged in two orthogonal directions. The movable barrel 311 can freely move in the longitudinal direction and the lateral direction within a predetermined range on the plane orthogonal to the optical axis by a resultant driving forces in two directions orthogonal to each other. The Hall IC 325 converts the magnetic flux density of the position detecting magnet 314 into an electrical signal. The Hall IC 325 detects the position of the movable barrel 311 relative to the main plate 303.

Figure 6A:
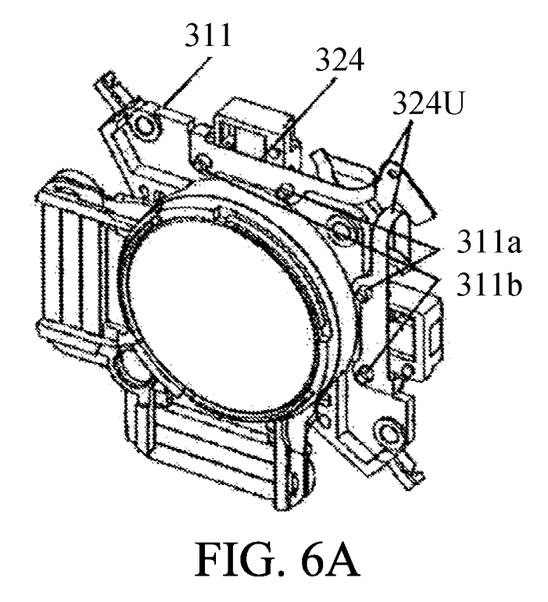
FIGS. 6A and 6B are perspective views showing a configuration of a movable flexible substrate.
Figure 6B:
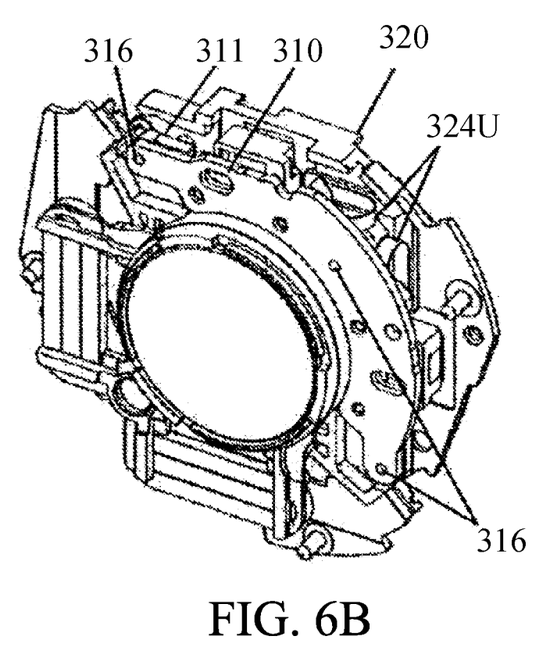

FIGS. 6A and 6B are structural perspective views of the movable flexible substrate 324. FIG. 6A illustrates the movable flexible substrate 324 incorporated into the movable lens barrel 311. The movable flexible substrate 324 is illustrated in the form of an incorporated state. FIG. 6B illustrates the movable flexible substrate 324 sandwiched between the first guide plate 310 and the sensor holding plate 320. A U-turn movable portion 324U is made by sandwiching the movable flexible substrate 324 by the respective contacting portions of the movable member and the fixed member and by reversely disposing the combination in the optical axis orthogonal direction. In other words, the movable flexible substrate 324 is sandwiched and bent between the movable member and the fixed member. As described above, the movable barrel 311 is movable in the longitudinal direction and the lateral direction on the plane orthogonal to the optical axis. The movable barrel 311 is permitted to move by the action of the U-turn movable portion 324U. The movable flexible substrate 324 is fixed onto the movable lens barrel 311 where extending part of the U-turn movable portion 324U is positioned by positioning pins 311a and 311b provided on the movable lens barrel 311.

Figure 7A:
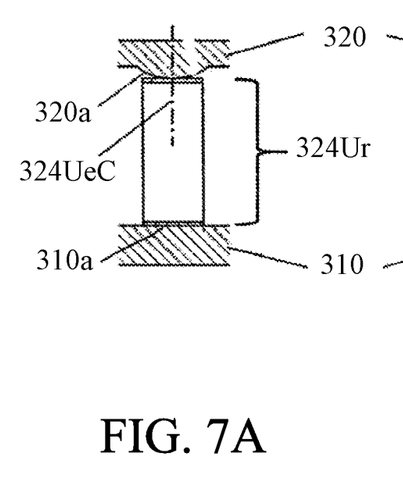
FIGS. 7A and 7B are sectional views of a movable portion of the movable flexible substrate.
Figure 7B:
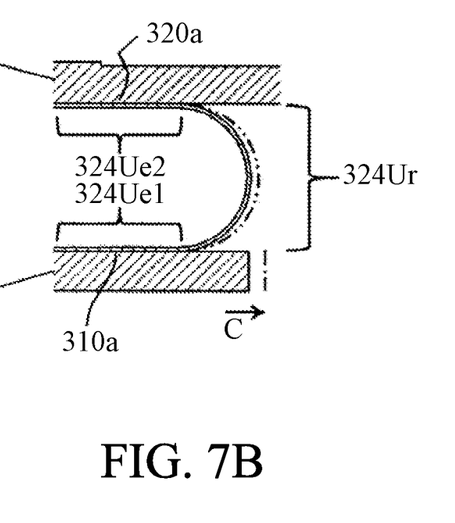

FIGS. 7A and 7B are sectional views of the movable portion of the movable flexible substrate 324. FIG. 7A is a sectional view of the U-turn movable portion 324U viewed from the optical axis orthogonal direction. FIG. 7B is a sectional view of the U-turn movable portion 324U viewed from the side. The U-turn movable portion 324U is sandwiched by the first guide plate 310 and the sensor holding plate 320. The U-turn movable portion 324U has a semicircular U-turn R portion (flexion portion) 324Ur. The U-turn movable portion 324U includes an extending deformable portion (first extending portion) 324Ue1 connected to one side of the U-turn R portion 324Ur and an extending deformable portion (second extending portion) 324Ue2 connected to the other side of the U-turn R portion 324Ur. The extending deformable portions 324Ue1 and 324Ue2 contact the first guide plate 310 and the sensor holding plate 320, respectively. The first guide plate 310 has a first contacting portion 310a that contacts the extending deformable portion 324Ue1. The sensor holding plate 320 has a second contacting portion 320a that contacts the extending deformable portion 324Ue2. The first contacting portion 310a and the second contacting portion 320a are parallel to each other. The first guide plate 310 and the sensor holding plate 320 sandwich the U-turn movable portion 324U so that the extending deformable portions 324Ue1 and 324Ue2 are parallel to each other.

As the first guide plate 310 moves by '1' in an arrow C direction in FIG. 7B, a U-turn R portion 324Ur moves by '0.5' as shown by an alternate long and two short dashes line. For description convenience, the U-turn movable part 324U is distinguished by the U-turn R portion 324Ur and the extending deformable portions 324Ue1 and 324Ue2, but both are coupled and the convenient boundary portion is moved by the movement of the first guide plate 310. In other words, the movable barrel 311 is permitted to move in the arrow C direction relative to the U-turn movable portion 324U by the position movement of the U-turn R portion 324Ur.

The U-turn R portion 324Ur is formed by sandwiching the U-turn movable portion 324U between the first guide plate 310 and the sensor holding plate 320. Even if the U-turn R portion 324Ur moves as the first guide plate 310 moves, no force is generated to restore the movement. In other words, there is no driving load that increases in proportion to the movement amount in the movement in this direction, although there is a deformation resistance as the boundary portion between the U-turn R portion 324Ur and the extending deformable portions 324Ue1 and 324Ue2 moves. Since the load center does not shift from the control center, the driving power can be saved.

As illustrated in FIG. 7A, the first contacting portion 310a is flat, and the second contacting portion 320a is arc-shaped. The second contacting portion 320a is formed along the extending direction of the extending deformable portion 324Ue2. The second contacting portion 320a contacts the extending deformable portion 324Ue2 at a width center 324UeC of the extending deformable portions 324Ue1 and 324Ue2.

Figure 8A:
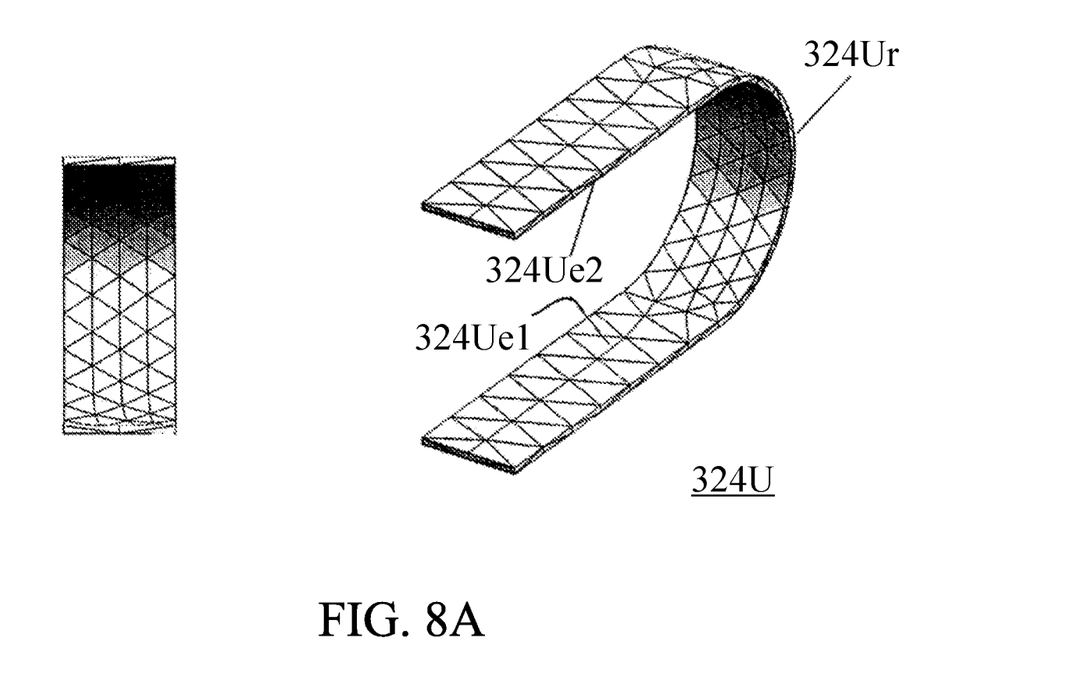
FIGS. 8A and 8B are explanatory views of a torsional deformation of the movable flexible substrate.
Figure 8B:
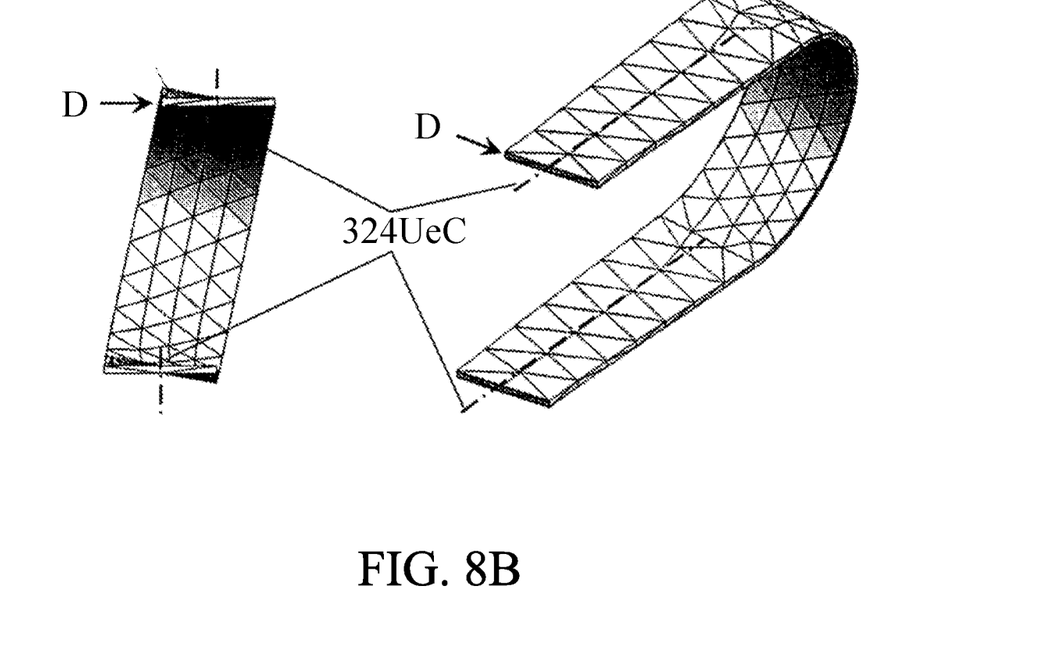

FIGS. 8A and 8B are explanatory views of a torsional deformation of the movable flexible substrate 324. The left view in FIG. 8A illustrates the U-turn movable portion 324U viewed from the same direction as that of FIG. 7A, and the right view is a perspective view of the U-turn movable portion 324U. FIG. 8B illustrates a simulation result of the deformation of the U-turn movable unit 324U when a force is applied in an arrow D direction from the state of FIG. 8A. This embodiment fixes the end portion of the extending deformable portion 324Ue1, prevents the end portion of the extending deformable portion 324Ue2 from sliding in the arrow D direction in FIG. 8B, and applies no other restraints. The arrow D direction is orthogonal to the arrow C direction in FIG. 7B.

As illustrated in FIG. 8B, the extending deformable portion 324Ue2 parallel moves in the arrow D direction. Its left side including the U-turn R portion 324Ur bends upwardly with respect to the width center 324UeC as a boundary, and its right side bends downwardly. In other words, a movement in the arrow D direction relative to the U-turn movable portion 324U is permitted by the torsional deformation in the U-turn movable portion 324U. The second contacting portion 320a in FIG. 7A has a clearance shape (shape with clearance) for the torsional deformation of the U-turn movable portion 324U. Thereby, the driving load of the movable barrel 311 can be reduced in the arrow D direction. The torsional deformation of the U-turn movable portion 324U increases in proportion to the movement amount in the arrow D direction. Since the load center is unlikely to incline to the control center, the power is generally saved.

In this embodiment, the first guide plate 310 receives the extending deformable portion 324Ue1 on a flat surface. Then, the above deformation inhibits a natural deformation, but the driving load of the movable lens barrel 311 can be reduced when the curvature radius of the U-turn R portion 324Ur is made larger or the extending deformable portion 324Ue1 is made longer. The first contacting portion 310a may have a clearance shape similar to that of the second contacting portion 320a.

Figure 9A:
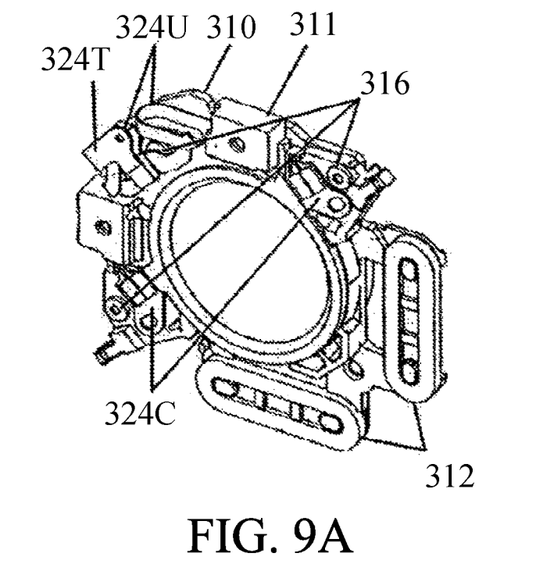
FIGS. 9A and 9B are explanatory views of an electrical connection of the movable flexible substrate.
Figure 9B:
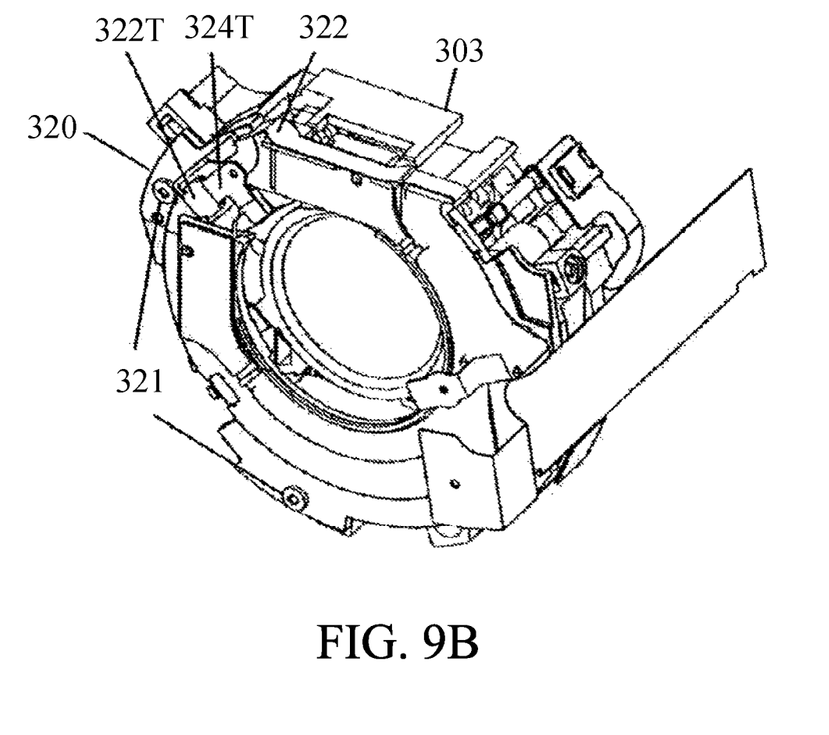

FIGS. 9A and 9B are explanatory views of the electrical connection of the movable flexible substrate 324. FIG. 9A illustrates the movable barrel 311 where the coil 312 is adhered and the first guide plate 310 is fixed by the screw 316. FIG. 9B is a perspective view of the image stabilization apparatus 31. A connector 324C electrically connects the movable flexible substrate 324 to the coil 312. Leaders of the winding start and end of the coil 312 are soldered to a land portion of the connector 324C. A connector 324T is inserted into a connector 322T mounted on the relay flexible substrate 322. Thereby, the movable flexible substrate 324 and the relay flexible substrate are electrically connected to each other.

Figures 10A, 10B, 10C:
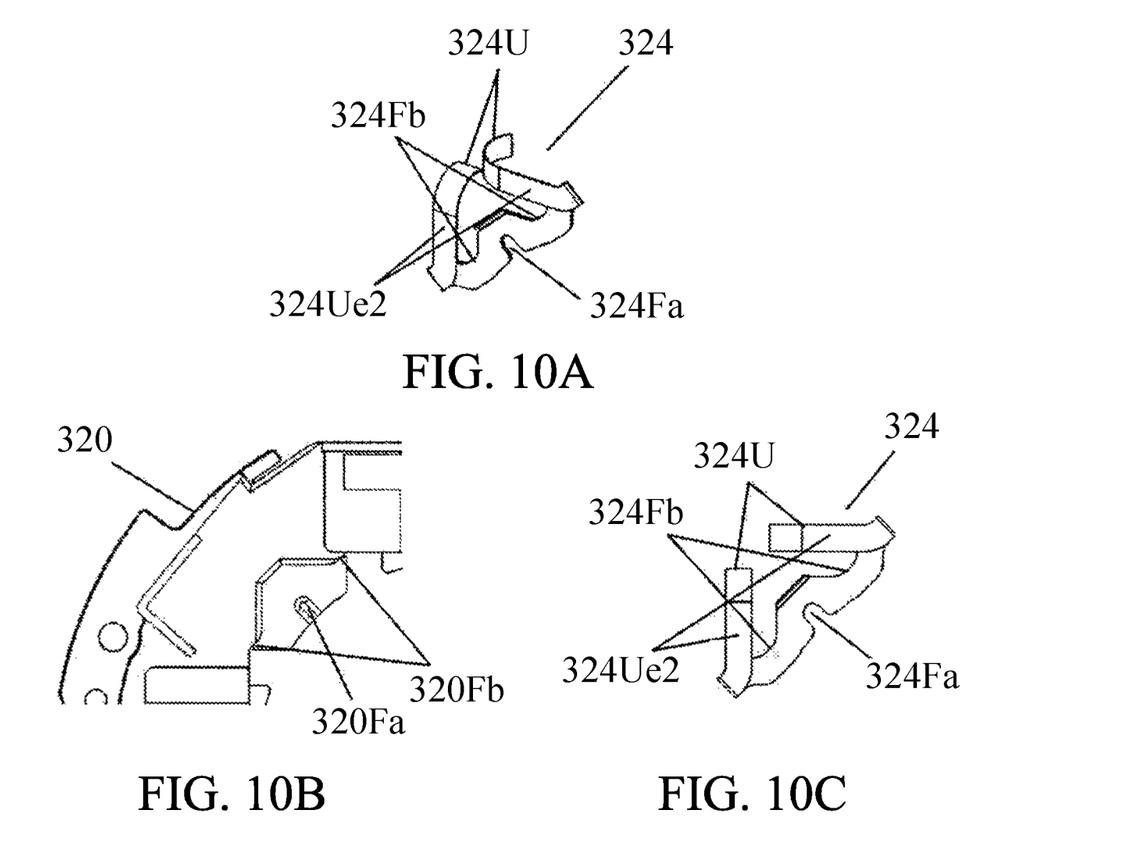
FIGS. 10A to 10E are explanatory views at a fixed end of the movable flexible substrate.
Figure 10D:
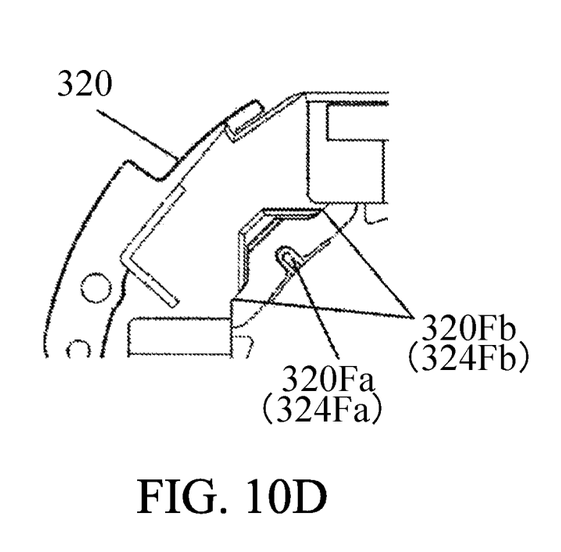
Figure 10E:
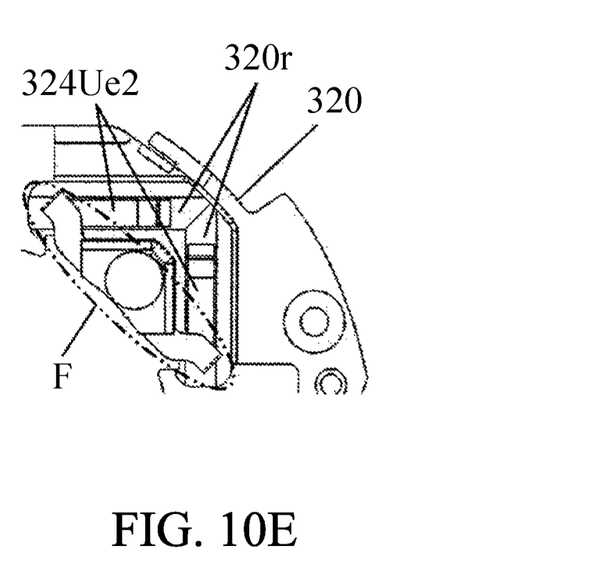

FIGS. 10A to 10E are explanatory views of the fixed end of the movable flexible substrate 324. FIG. 10A is a perspective view of part of the movable flexible substrate 324 viewed in the same direction as that of FIG. 9A. FIG. 10A illustrates part of the U-turn movable portion 324U and fixed part onto the sensor holding plate 320, and omits the connector 324T. FIG. 10B is a partial view of a portion for fixing the sensor holding plate 320 of the movable flexible substrate 324. FIG. 10C illustrates the movable flexible substrate 324 viewed in the same direction as that of FIG. 10B. FIG. 10D illustrates the movable flexible substrate 324 incorporated into the sensor holding plate 320. FIG. 10E is a rear view of FIG. 10D.

A description will now be given of a structure of positioning and fixing the movable flexible substrate 324 onto the sensor holding plate 320. The end of the extending deformable portion 324Ue2 of the U-turn movable portion 324U is folded back obliquely. For positioning and fixing purposes, the movable flexible substrate 324 has a positioning groove portion 324Fa and two detents 324Fb for determining an assembly angle. The sensor holding plate 320 has a positioning boss portion 320Fa and two vertical wall portions 320Fb. The movable flexible substrate 324 is positioned and fixed by the sensor holding plate 320 due to the engagement between the positioning groove portion 324Fa and the positioning boss portion 320Fa and the engagements between the detents 324Fb and the standing walls 320Fb. As illustrated in FIG. 10E, an oval portion F of an alternate long and two dashes line forms a fixed portion at the end of the extending deformable portion 324Ue2. The movable flexible substrate 324 is fixed at a predetermined position of the sensor holding plate 320 and sandwiched in the optical axis direction between the surface receiving the movable flexible substrate 324 of the sensor holding plate 320 and the second contacting portion 320a.

As described above, the movable lens barrel 311 is permitted to move relative to the sensor holding plate 320 by the U-turn movable portion 324U. The U-turn movable portion 324U has a predetermined shape because it is held by and contacts the first contacting portion 310a and the second contacting portion 320a. The limitation of the occupied space is definite. It is thus possible to significantly reduce an unnecessary space for assembly scattering, etc., and to prevent an inadvertent contact with other components. Since the U-turn movable portion 324U is not previously bent, the assembly is highly stable and the image stabilization apparatus 31 can exhibit an excellent image stabilization performance.

This embodiment provides two U-turn movable portions 324U at vertical and horizontal positions, but the U-turn movable portion 324U may be integrated with the movable lens barrel 311 and the U-turn movable portion 324U may be provided at only one location. While the U-turn movable portion 324U is provided between the first guide plate 310 and the sensor holding plate 320, it may be provided between the first guide plate 310 and the base plate 303. While the flexible substrate is used as a flexible sheet member, a flexible flat cable (FFC) etc. may be used, which has a different structure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-163149, filed on Aug. 31, 2018, which is hereby incorporated by reference herein in its entirety.

What is claimed is:
1. An image stabilization apparatus comprising:
a movable member configured to hold an image stabilization optical element;
a fixed member holding the movable member movably in a direction crossing an optical axis;
an electrical element mounted on the movable member; and
a flexible sheet member electrically connecting the electric element to the fixed member, wherein the flexible sheet member is bent between the movable member and the fixed member, wherein the flexible sheet member includes a semicircular flexion portion, a first extending portion extending from the semicircular flexion portion towards the movable member side, and a second extending portion extending from the semicircular flexion portion towards the fixed member side, wherein the movable member includes a first contacting portion contacting the first extending portion, wherein the fixed member includes a second contacting portion contacting the second extending portion, wherein at least one of the first contacting portion and the second contacting portion has a convex shape, the convex shape being formed so that a part of the convex shape contacts the first extending portion or the second extending portion and so that the convex shape is covered by the first extending portion or the second extending portion, wherein the convex shape is formed along an extending direction of the at least one of the first contacting portion and the second contacting portion, wherein the extending direction of the at least one of the first contacting portion and the second contacting portion is orthogonal to the optical axis, wherein the first extending portion and the second extending portion are sandwiched between the movable member and the fixed member and are disposed opposite to each other, and wherein, in a cross-sectional view orthogonal to the extending direction of the at least one of the first contacting portion and the second contacting portion, the part of the convex shape contacts a central portion of the first extending portion or a central portion of the second extending portion and other parts of the convex shape are spaced apart from edge portions of the first extending portion or the second extending portion.

2. The image stabilization apparatus according to claim 1, wherein the apparatus is configured such that the first contacting portion and the second contacting portion are parallel to each other.

3. The image stabilization apparatus according to claim 1, wherein the movable member is permitted to move relative to the fixed member by a positional movement of the semicircular flexion portion and a torsional deformation of the semicircular flexion portion, the first extending portion, and the second extending portion.

4. The image stabilization apparatus according to claim 1, wherein the convex shape is arc-shaped.

5. The image stabilization apparatus according to claim 1, wherein the first extending portion is movable relative to the movable member having the convex shape, or the second extending portion is movable relative to the fixed member having the convex shape.

6. A lens apparatus comprising:
an imaging optical system; and
an image stabilization apparatus,
wherein the image stabilization apparatus includes:
a movable member holding an image stabilization optical element included in the imaging optical system;
a fixed member holding the movable member movably in a direction crossing an optical axis;
an electrical element mounted on the movable member; and
a flexible sheet member electrically connecting the electric element to the fixed member, wherein the flexible sheet member is bent between the movable member and the fixed member, wherein the flexible sheet member includes a semicircular flexion portion, a first extending portion extending from the semicircular flexion portion towards the movable member side, and a second extending portion extending from the semicircular flexion portion towards the fixed member side, wherein the movable member includes a first contacting portion contacting the first extending portion, wherein the fixed member includes a second contacting portion contacting the second extending portion, wherein at least one of the first contacting portion and the second contacting portion has a convex shape, the convex shape being formed so that a part of the convex shape contacts the first extending portion or the second extending portion and so that the convex shape is covered by the first extending portion or the second extending portion, wherein the convex shape is formed along an extending direction of the at least one of the first contacting portion and the second contacting portion, wherein the extending direction of the at least one of the first contacting portion and the second contacting portion is orthogonal to the optical axis, wherein the first extending portion and the second extending portion are sandwiched between the movable member and the fixed member and are disposed opposite to each other, and wherein, in a cross-sectional view orthogonal to the extending direction of the at least one of the first contacting portion and the second contacting portion, the part of the convex shape contacts a central portion of the first extending portion or a central portion of the second extending portion and other parts of the convex shape are spaced apart from edge portions of the first extending portion or the second extending portion.

7. A camera comprising:
a lens apparatus; and
an image sensor configured to receive an image formed by the lens apparatus,
wherein the lens apparatus includes:
an imaging optical system; and
an image stabilization apparatus,
wherein the image stabilization apparatus includes:
a movable member holding an image stabilization optical element included in the imaging optical system;
a fixed member holding the movable member movably in a direction crossing an optical axis;
an electrical element mounted on the movable member; and
a flexible sheet member electrically connecting the electric element to the fixed member, wherein the flexible sheet member is bent between the movable member and the fixed member, wherein the flexible sheet member includes a semicircular flexion portion, a first extending portion extending from the semicircular flexion portion towards the movable member side, and a second extending portion extending from the semicircular flexion portion towards the fixed member side, wherein the movable member includes a first contacting portion contacting the first extending portion, wherein the fixed member includes a second contacting portion contacting the second extending portion, wherein at least one of the first contacting portion and the second contacting portion has a convex shape, the convex shape being formed so that a part of the convex shape contacts the first extending portion or the second extending portion and so that the convex shape is covered by the first extending portion or the second extending portion, wherein the convex shape is formed along an extending direction of the at least one of the first contacting portion and the second contacting portion, wherein the extending direction of the at least one of the first contacting portion and the second contacting portion is orthogonal to the optical axis, wherein the first extending portion and the second extending portion are sandwiched between the movable member and the fixed member and are disposed opposite to each other, and wherein, in a cross-sectional view orthogonal to the extending direction of the at least one of the first contacting portion and the second contacting portion, the part of the convex shape contacts a central portion of the first extending portion or a central portion of the second extending portion and other parts of the convex shape are spaced apart from edge portions of the first extending portion or the second extending portion.

* * * * *